(12) United States Patent
Nikaido

(10) Patent No.: US 8,478,022 B2
(45) Date of Patent: Jul. 2, 2013

(54) FAILURE ANALYSIS METHOD, APPARATUS, AND PROGRAM FOR SEMICONDUCTOR INTEGRATED CIRCUIT

(75) Inventor: Masafumi Nikaido, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 603 days.

(21) Appl. No.: 12/656,723

(22) Filed: Feb. 16, 2010

(65) Prior Publication Data

US 2010/0241374 A1 Sep. 23, 2010

(30) Foreign Application Priority Data

Feb. 18, 2009 (JP) ................................. 2009-035576

(51) Int. Cl.
*G06K 9/00* (2006.01)

(52) U.S. Cl.
USPC .......................................... 382/145; 382/152

(58) Field of Classification Search
USPC .............. 382/144–152; 702/85–95, 104–107; 430/311–313
See application file for complete search history.

(56) References Cited

U.S. PATENT DOCUMENTS 5,497,331 A * 3/1996 Iriki et al. ...................... 700/121
7,595,488 B2 9/2009 Tashiro et al.
2001/0000460 A1 * 4/2001 Ishihara et al. ............... 382/149
2007/0020781 A1 1/2007 Majima et al.
2010/0080446 A1 * 4/2010 Herschbein et al. .......... 382/149

FOREIGN PATENT DOCUMENTS

| JP | 6-120312 A | 4/1994 |
| JP | 2006-177896 A | 7/2006 |
| JP | 2007-5497 | 1/2007 |

OTHER PUBLICATIONS

Japanese Office Action dated Jan. 20, 2011, with partial English translation.

* cited by examiner

*Primary Examiner* — Tri T Ton
(74) *Attorney, Agent, or Firm* — McGinn IP Law Group, PLLC

(57) ABSTRACT

A failure analysis method for a semiconductor integrated circuit includes deriving a coordinate in a device coordinate system in analysis data for abnormal signal data included in the analysis data of a semiconductor integrated circuit, deriving a correspondence between a coordinate in the device coordinate system and a coordinate in a design coordinate system in design data of the semiconductor integrated circuit for a plurality of reference points in the semiconductor integrated circuit, deriving a coordinate conversion formula between the device coordinate system and the design coordinate system, deriving a position error between a coordinate in the device coordinate system converted by the coordinate conversion formula and a coordinate in the design coordinate system, and extracting a circuit related to an abnormal signal in the design data based on coordinates of the abnormal signal in the device coordinate system using the coordinate conversion formula and the position error.

18 Claims, 12 Drawing Sheets

FIG. 7   REFERENCE POINTS IN DESIGN DATA

FAILURE ANALYSIS METHOD, APPARATUS, AND PROGRAM FOR SEMICONDUCTOR INTEGRATED CIRCUIT

TECHNICAL FIELD

Reference to Related Application

This application is based upon and claims the benefit of the priority of Japanese patent application No. 2009-035576, filed on Feb. 18, 2009, the disclosure of which is incorporated herein in its entirety by reference thereto.

The present invention relates to a failure analysis method, failure analysis apparatus, and a failure analysis program for a semiconductor integrated circuit, and particularly to a failure analysis method, failure analysis apparatus, and a failure analysis program that extract a related circuit from the image data of an abnormal signal obtained from a semiconductor inspection apparatus.

BACKGROUND

In failure analysis of semiconductor integrated circuits, conventionally available semiconductor inspection apparatuses for acquiring an observed image include emission microscopes, OBIRCH apparatuses, and time-resolved emission microscopes. These inspection apparatuses are able to analyze such a failure as a broken part in a semiconductor integrated circuit by use of an image acquired as a failure observed image.

Patent Document 1 describes a semiconductor failure analysis method for analyzing a failure of a semiconductor device, using an observed image thereof, failure analysis apparatus, and failure analysis program. The method includes an inspection information acquiring step of acquiring a failure observed image containing reaction information arising from a failure, acquired by conducting an inspection about the failure, as an observed image of the semiconductor device; and a layout information acquiring step of acquiring layout information of the semiconductor device. The method further includes a region setting step of setting an analysis region in correspondence to the reaction information with reference to the failure observed image; a net information analyzing step of extracting a net passing the analysis region, from a plurality of nets included in a layout of the semiconductor device; and an information displaying step of letting display means display information about a result of the analysis of the failure of the semiconductor device obtained by the region setting step and the net information analyzing step. The analysis region is set wider than the reaction regions in the failure observed image, in consideration of positional accuracy of the stage on which the semiconductor device is mounted during inspection (Paragraph 0035 of Patent document 1). The position alignment between the observed image and the layout image is performed by designating three points in the observed image and three corresponding points in the layout image, and effecting position adjustment from coordinates of these points. The position alignment may be performed by designating four or more points as necessary (Paragraph 0078). Further, Patent Document 1 mentions that operation buttons for manually carrying out fine adjustments of position alignment such as rotating the pattern image, and positioning and zooming the layout image are provided (Paragraph 0080).

Patent Document 1

Japanese Patent Kokai Publication No. JP-P2007-5497A, which corresponds to US Patent Application Publication No. US2007/0020781 A1.

SUMMARY

The entire disclosures of Patent Documents are incorporated herein by reference thereto.

The following analysis is given by the present invention. An abnormal signal obtained from a semiconductor inspection apparatus is generally obtained as an image (observed image). Due to the miniaturization of the LSI structure, it is getting more difficult to visually recognize the position of the observed image and of the abnormal signal on the design data in the observed image. Further, because of the way LSIs are structured, the observed image may be obtained only from the reverse side. In this case, observation can be made using infrared light, however, it is difficult to specify the position of the abnormal signal on the design data from the image since the structure of patterns cannot be obtained clearly.

According to Patent Document 1, by using the coordinates of corresponding three points of the observed image and of the design data, the positions of the observed image and the design data can be aligned. In reality, however, when a failed LSI, which is a sample, is set on the stage of the apparatus, there are an inclination of the sample, irregularities on the observed surface of the sample, and a position error of the stage of the analysis apparatus. Therefore, an error occurs when the position of the abnormal signal on the design data is derived. For instance, if an error in position alignment occurs in reverse side analysis, it is very difficult to correct the error since the pattern of the observed image is not clear. In order to avoid this, the abnormal signal is set wide in Patent Document 1 (Paragraph 0035). If the abnormal signal is set sufficiently wider than the position error, failed circuits can be reliably extracted, however, many circuits unrelated to the failure (pseudo-failed circuits) will be extracted. Truly failed circuits have to be extracted from a list that includes many pseudo-failed circuits. On the other hand, if the abnormal signal is set narrower than the position error, truly failed circuits may be overlooked.

The amount of this position error changes at every observation, i.e., every failure sample, due to the inclination of the sample surface and the position error of the stage. Therefore, in order to accurately narrow down failed circuits, the amount of the position error that changes at every observation has to be precisely estimated.

A failure analysis method for a semiconductor integrated circuit according to an aspect of the present invention comprises deriving a coordinate in a device coordinate system in analysis data for abnormal signal data included in the analysis data of a semiconductor integrated circuit obtained from a semiconductor inspection apparatus; deriving a correspondence between a coordinate in the device coordinate system and a coordinate in a design coordinate system in design data of the semiconductor integrated circuit for a plurality of reference points in the semiconductor integrated circuit, and deriving a coordinate conversion formula between the device coordinate system and the design coordinate system; deriving a position error between a coordinate in the device coordinate system converted by the coordinate conversion formula and a coordinate in the design coordinate system; and extracting a circuit related to the abnormal signal in the design data based on the coordinates of the abnormal signal in the device coordinate system using the coordinate conversion formula and the position error.

A failure analysis apparatus for a semiconductor integrated circuit according to another aspect of the present invention has a signal detection portion that derives a coordinate in a device coordinate system in analysis data for abnormal signal data included in the analysis data of a semiconductor integrated circuit obtained from a semiconductor inspection apparatus; a coordinate conversion portion that derives a correspondence between a coordinate in the device coordinate system and a coordinate in the design coordinate system in design data of the semiconductor integrated circuit for a plurality of reference points in the semiconductor integrated circuit, and that derives a coordinate conversion formula between the device coordinate system and the design coordinate system; an error calculation portion that derives a position error between a coordinate in the device coordinate system converted by the coordinate conversion formula and a coordinate in the design coordinate system; and a circuit extraction portion that extracts a circuit related to the abnormal signal in the design data based on the coordinates of the abnormal signal in the device coordinate system using the coordinate conversion formula and the position error.

Yet another aspect of the present invention, there is provided a computer program which causes a computer to execute the failure analysis method described above. Further, yet another aspect of the present invention, there is provided a computer program which causes a computer to function as the failure analysis apparatus described above. The program may be stored in a computer readable storage medium.

The meritorious effects of the present invention are summarized as follows.

According the present invention, since a coordinate conversion formula between a device coordinate system and a design coordinate system is derived, a position error by this coordinate conversion formula is derived, and a circuit related to an abnormal signal is extracted using the coordinate conversion formula and the position error, a circuit related to the abnormal signal can be accurately extracted.

PREFERRED MODES

Figure 1:
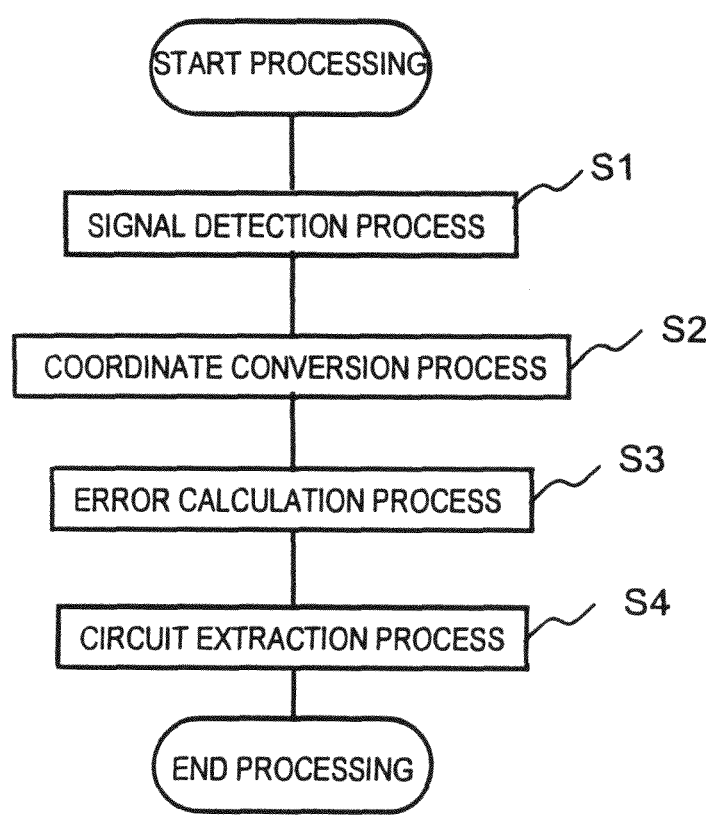
FIG. 1 is a schematic process flowchart of a failure analysis method for a semiconductor integrated circuit according to a mode of the present invention.

Modes of the present invention will be described with reference to the drawings as necessary. It should be noted that the drawings and symbols in the drawings referred to in the description of the modes are used to describe an example of a mode, and they do not limit variations of the modes of the present invention.

Figure 9:
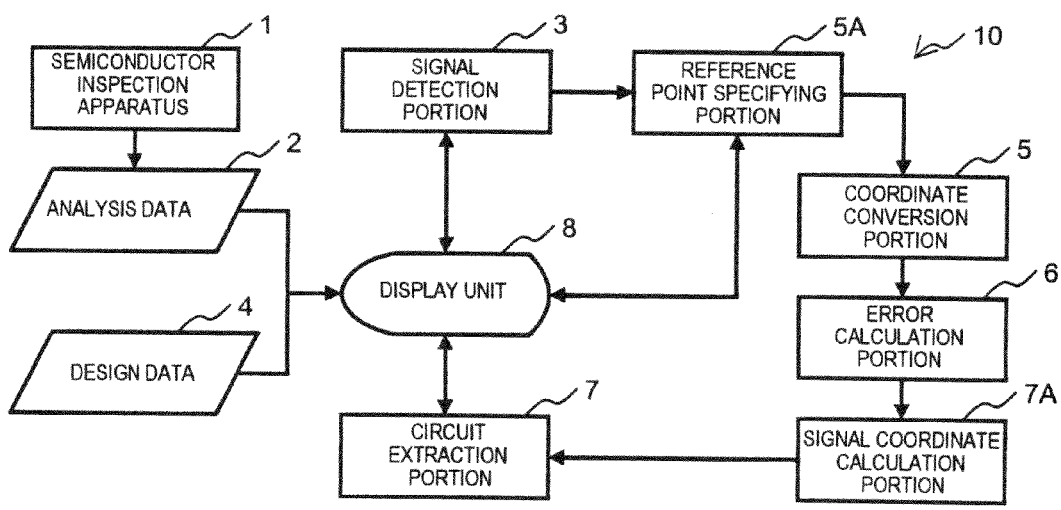
FIG. 9 is a block diagram of a failure analysis apparatus according to an example of the present invention.

For instance, as shown in FIGS. 1 and 9, a failure analysis method for a semiconductor integrated circuit according to a mode of the present invention has a signal detection process S1 that derives coordinates in a device coordinate system in analysis data 2 for abnormal signal 11 data included in the analysis data 2 of a semiconductor integrated circuit obtained from a semiconductor inspection apparatus 1; a coordinate conversion process S2 that derives a correspondence between a coordinate in the device coordinate system and a coordinate in a design coordinate system in the design data of the semiconductor integrated circuit for a plurality of reference points in the semiconductor integrated circuit, and that derives a coordinate conversion formula between the device coordinate system and the design coordinate system; an error calculation process S3 that derives a position error between a coordinate in the device coordinate system converted by the coordinate conversion formula and a coordinate in the design coordinate system; and a circuit extraction process S4 that extracts a circuit related to the abnormal signal in the design data based on the coordinates of the abnormal signal 11 in the device coordinate system using the coordinate conversion formula and the position error. In other words, since the coordinate conversion formula and the position error calculated by the coordinate conversion formula are derived and a circuit related to the abnormal signal is extracted using the coordinate conversion formula and the position error, a failed circuit causing the abnormal signal can be specified for the abnormal signal in a failed LSI observed by a semiconductor inspection apparatus. More particularly, by quantitatively deriving the amount of an error in position alignment that changes at every observation and extracting a circuit that passes through a region obtained by widening the coordinates of the abnormal signal by the error amount, a truly failed circuit can be extracted while reducing the number of pseudo-failed circuits extracted.

Figure 2:
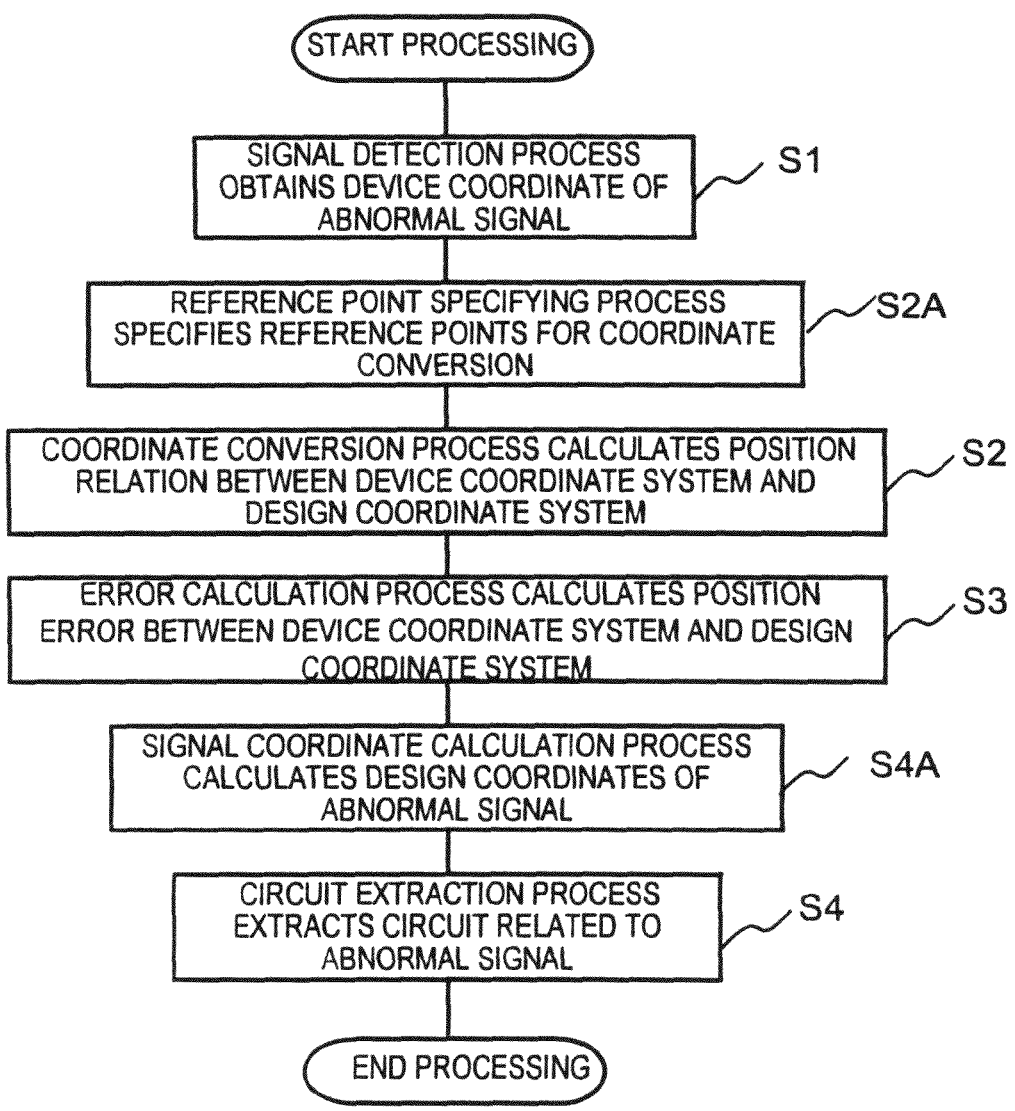
FIG. 2 is a detailed process flowchart of the failure analysis method for a semiconductor integrated circuit according to an example of the present invention.

Further, for instance, as shown in FIG. 2, in the failure analysis method for a semiconductor integrated circuit according to a mode of the present invention, the coordinate conversion process S2 includes a reference point specifying process S2A that specifies a plurality of reference points, and the circuit extraction process S4 includes a signal coordinate calculation process S4A that derives the range of the abnormal signal in the design coordinate system using the coordinate conversion formula and the position error.

Further, in the failure analysis method for a semiconductor integrated circuit according to a mode of the present invention, the coordinate conversion formula is calculated for a plurality of coordinates in the device coordinate system and the design coordinate system respectively using a least-squares method in the coordinate conversion process S2. Since a least-squares method is used, there is no human factor in position alignment and coordinate conversion can be performed accurately. Further, even when the observed image is distorted due to an inclination of the observed surface, an error in position alignment can be kept to a minimum.

Further, in the failure analysis method for a semiconductor integrated circuit according to a mode of the present invention, the mean square error is derived by the coordinate conversion formula for a plurality of coordinates, and the position error is derived from the mean square error in the error calculation process S3. The mean square error may be treated as the position error, or the position error may be derived by multiplying the mean square error by a coefficient, or by adding a coefficient to the mean square error. In any case, by deriving the position error using the mean square error, an appropriate amount of position error can be derived without any human factor. More particularly, by quantitatively deriving the amount of an error in position alignment that changes at every observation and extracting a circuit that passes through a region obtained by widening the coordinates of the abnormal signal by the error amount, a truly failed circuit can be extracted while reducing the number of pseudo-failed circuits extracted.

Further, in the failure analysis method for a semiconductor integrated circuit according to a mode of the present invention, correspondences between coordinates are derived for a number of reference points exceeding a minimum required number for deriving a coordinate conversion formula, a coordinate conversion formula is tentatively derived using an arbitrary number of reference points among the reference points for which coordinate correspondences are derived, the sum of the position error of each reference point is derived as the conversion error using the tentatively derived coordinate conversion formula, and the coordinate conversion formula that derives the smallest conversion error is deemed the final coordinate conversion formula in the coordinate conversion process. Since position accuracy may change depending on how the reference points are taken, coordinates are derived for a number of reference points exceeding a minimum required number for solving a coordinate conversion formula, and the coordinate conversion formula can be tentatively derived using an arbitrary number of reference points among the reference points for which coordinates are derived. This arbitrary number of reference points include at least a number of reference points required for solving the coordinate conversion formula. Depending on which reference points are used, a plurality of tentative coordinate conversion formulas may exist, however, in this case, the amount of error variation due to the difference in how the reference points are taken can be reduced by deriving the conversion error using each coordinate conversion formula and selecting the coordinate conversion formula that derives the smallest conversion error as the final coordinate conversion formula. Particularly, even when the observed image is distorted due to unevenness of the observed surface, an error in position alignment can be kept to a minimum. Further, by quantitatively deriving the amount of an error in position alignment that changes at every observation and extracting a circuit that passes through a region obtained by widening the coordinates of the abnormal signal by the error amount, a truly failed circuit can be extracted while reducing the number of pseudo-failed circuits extracted.

Further, in the failure analysis method for a semiconductor integrated circuit according to a mode of the present invention, the coordinate conversion formula uses a projective transformation (for instance Formula (4)) and calculates projective transformation parameters from the coordinates of at least four reference points in the device coordinate system and the design coordinate system in the coordinate conversion process S2. In the case where a projective transformation is used to convert coordinates, since it is necessary to derive eight parameters ($a_o$, $b_o$, $a_1$, $b_1$, $c_1$, $a_2$, $b_2$, $c_2$) as shown in Formula (4), at least four reference points are needed. As a result, even when there is an image distortion such that a rectangular region of the sample becomes an arbitrary convex quadrilateral region of the analysis image because of an inclination of the observed surface, an error in position alignment can be kept to a minimum. Further, by quantitatively deriving the amount of an error in position alignment that changes at every observation and extracting a circuit that passes through a region obtained by widening the coordinates of the abnormal signal by the error amount, a truly failed circuit can be extracted while reducing the number of pseudo-failed circuits extracted.

Figure 6:
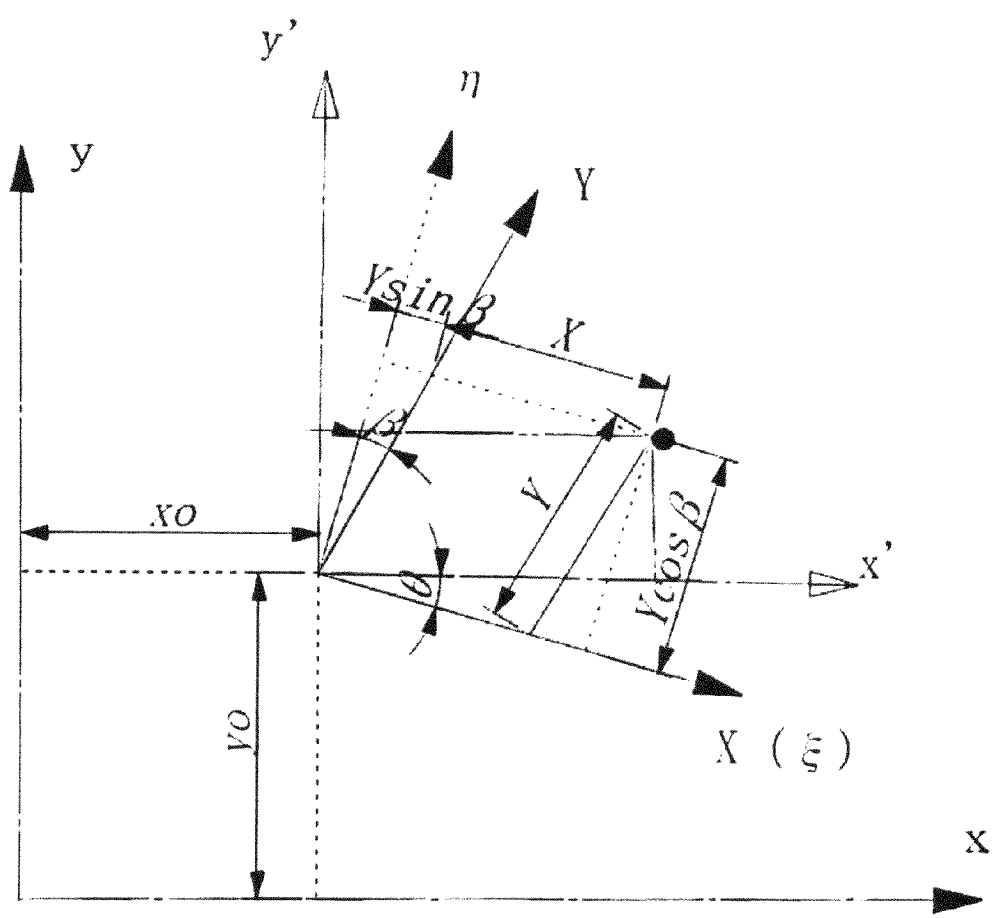
FIG. 6 is an example of how coordinates in a device coordinate system and coordinates in a design coordinate system are converted using a movement amount, rotation amount, inclination amount, and elasticity amount in an example of the present invention.

Further, in the failure analysis method for a semiconductor integrated circuit according to a mode of the present invention, for instance, as shown in FIG. 6, the coordinate conversion formula uses a movement amount (xo, yo), a rotation amount θ, an inclination amount β, and an elasticity amount (λx, λy), and calculates the movement amount (xo, yo), the rotation amount θ, the inclination amount β, and the elasticity amount (λx, λy) from the coordinates of at least three reference points in the device coordinate system and the design coordinate system in the coordinate conversion process S2. As described above, six parameters need to be derived, therefore at least three reference points are needed. As a result, even when there is an image distortion such that a rectangular region of the sample becomes a parallelogram of the analysis image because of an inclination of the observed surface, an error in position alignment can be kept to a minimum. Further, by quantitatively deriving the amount of an error in position alignment that changes at every observation and extracting a circuit that passes through a region obtained by widening the coordinates of the abnormal signal by the error amount, a truly failed circuit can be extracted while reducing the number of pseudo-failed circuits extracted.

Further, for instance, as shown in FIG. 9, a failure analysis apparatus 10 for a semiconductor integrated circuit according to a mode of the present invention has a signal detection portion 3 that derives a coordinate in a device coordinate system in the analysis data 2 for the abnormal signal 11 data included in the analysis data 2 of a semiconductor integrated circuit obtained from the semiconductor inspection apparatus 1; a coordinate conversion portion 5 that derives a correspondence between a coordinate in the device coordinate system and a coordinate in the design coordinate system in the design data 4 of the semiconductor integrated circuit for a plurality of reference points in the semiconductor integrated circuit, and that derives a coordinate conversion formula between the device coordinate system and the design coordinate system; an error calculation portion 6 that derives a position error between a coordinate in the device coordinate system converted by the coordinate conversion formula and a coordinate in the design coordinate system; and a circuit extraction portion 7 that extracts a circuit related to the abnormal signal 11 in the design data 4 based on the coordinates of the abnormal signal 11 in the device coordinate system using the coordinate conversion formula and the position error. Since a circuit related to the abnormal signal is extracted by using the coordinate conversion portion 5 that derives the coordinate conversion formula, the error calculation portion that derives the position error using the coordinate conversion formula derived by the coordinate conversion portion, the coordinate conversion formula derived by the coordinate conversion portion, and the position error derived by the error calculation portion, circuit extraction can be accurately performed.

For instance, as shown in FIG. 9, the failure analysis apparatus 10 for a semiconductor integrated circuit according to a mode of the present invention further includes a display unit 8 that displays the image data of the analysis data 2 and the image data of the design data 4, the coordinate conversion portion 5 includes a reference point specifying portion 5A that specifies a plurality of reference points, and the circuit extraction portion 7 includes a signal coordinate calculation portion 7A that derives the range 13 of the abnormal signal in the design coordinate system using the coordinate conversion formula and the position error.

Figure 4:
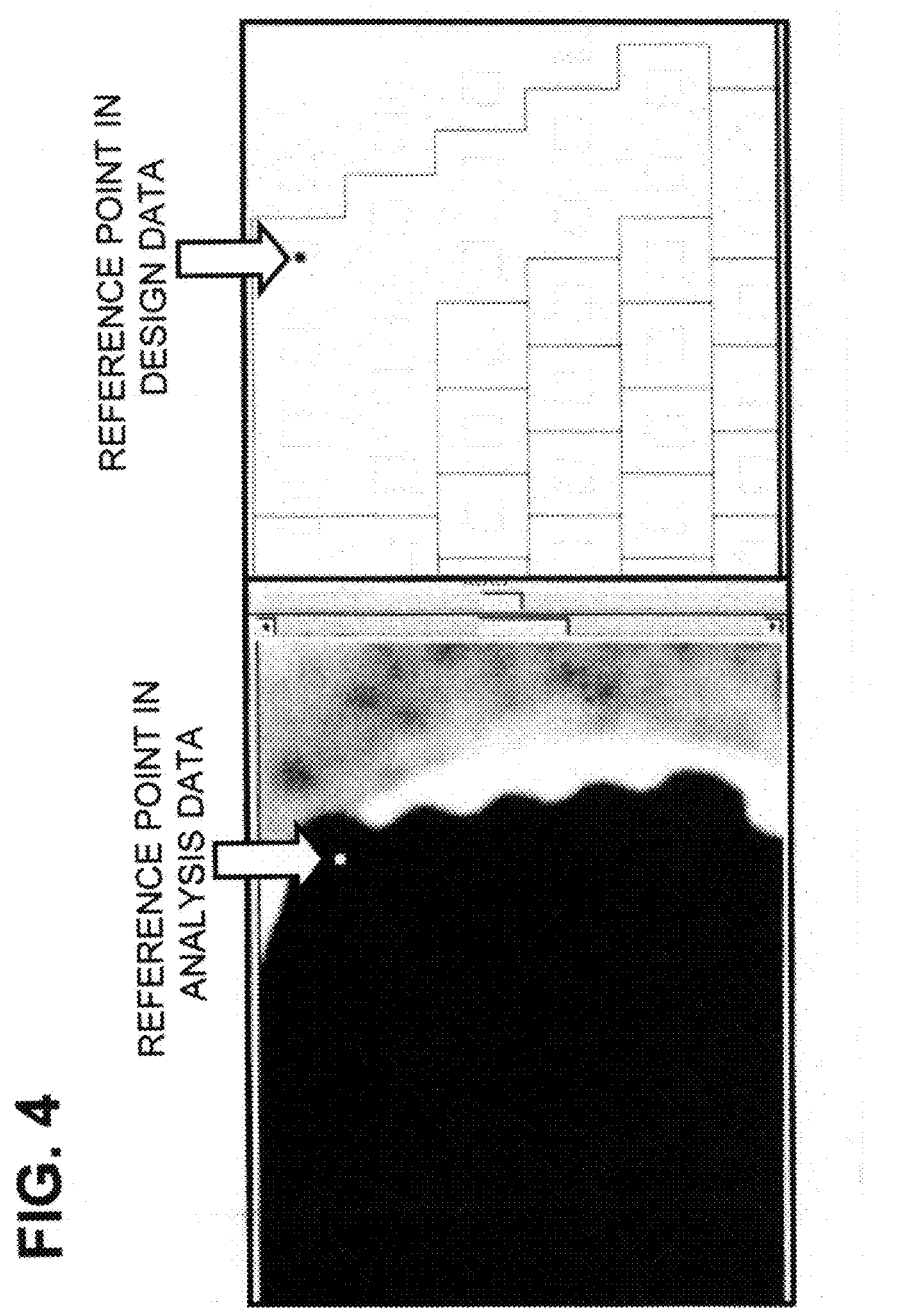
FIG. 4 is an example of how reference points are specified in an example of the present invention.
Figure 5:
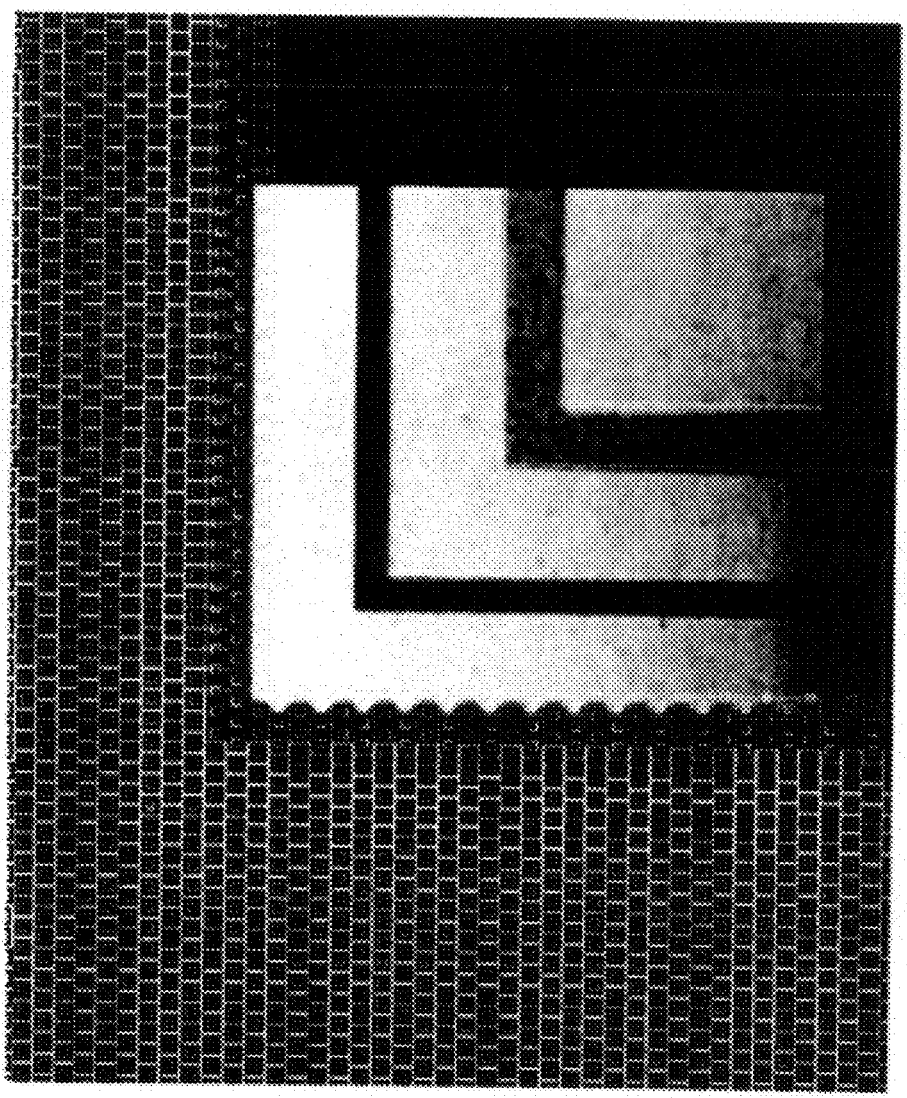
FIG. 5 is another example of how reference points are specified in an example of the present invention.

Further, in the failure analysis apparatus 10 for a semiconductor integrated circuit according to a mode of the present invention, the reference point specifying portion 5A lets a user input the coordinates of the reference points in the device coordinate system and the design coordinate system using the image data of the analysis data 2 and the design data 4 displayed by the display unit 8. For instance, the display unit can display the analysis data and the design data side by side as shown in FIG. 4, and the same point can be inputted as a reference point, or as shown in FIG. 5, the design data and the analysis data are superimposed and a reference point can be specified.

Figure 10:
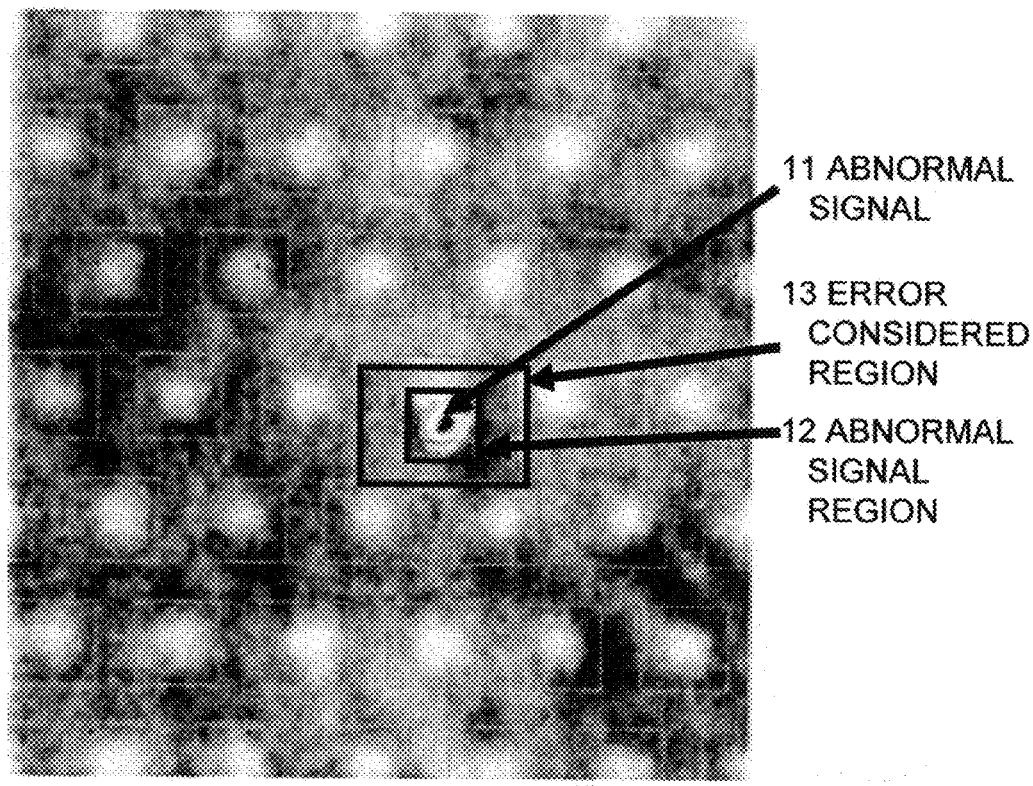
FIG. 10 is a drawing showing an example in which the abnormal signal in analysis data is displayed superimposed with the design data in an example of the present invention.
Figure 11:
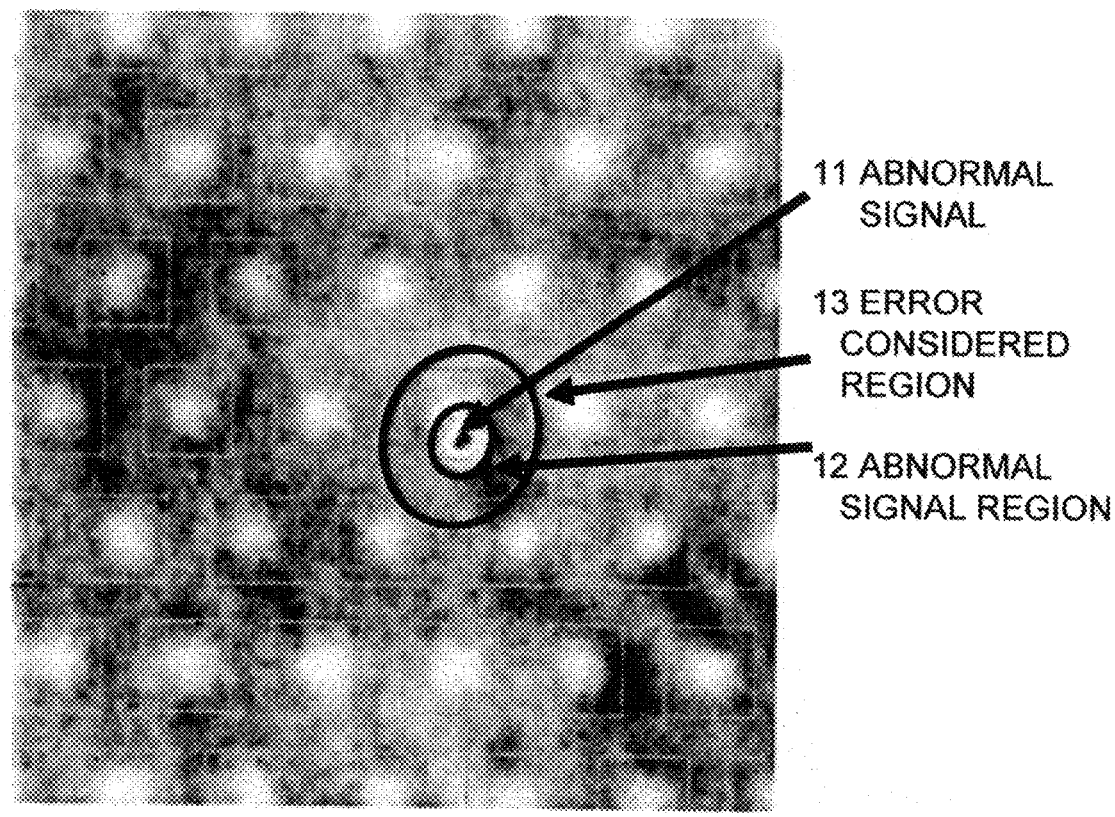
FIG. 11 is a drawing showing another example in which the abnormal signal in the analysis data is displayed superimposed with the design data in an example of the present invention.

Further, for instance, as shown in FIGS. 10 and 11, in the failure analysis apparatus 10 for a semiconductor integrated circuit according to a mode of the present invention, the display 8 displays the image data of the analysis data 2 that includes the abnormal signal 11 and the image data of the design data 4 that includes the image of the range 13 of the abnormal signal derived by the signal coordinate calculation portion 7A superimposed.

Further, for instance, in the failure analysis apparatus 10 for a semiconductor integrated circuit according to a mode of the present invention, the coordinate conversion portion 5 calculates the coordinate conversion formula for a plurality of coordinates in the device coordinate system and the design coordinate system respectively using a least-squares method. Since the coordinate conversion portion derives the parameters of the coordinate conversion formula using a least-squares method, an accurate coordinate conversion formula can be derived. Particularly, even when the observed image is distorted due to an inclination of the observed surface, an error in position alignment can be kept to a minimum.

Further, for instance, in the failure analysis apparatus 10 for a semiconductor integrated circuit according to a mode of the present invention, the error calculation portion 6 derives the mean square error by the coordinate conversion formula for a plurality of coordinates (refer to Formula (2) as an example), and the position error is derived from the mean square error. Since the position error is derived from the mean square error, an appropriate amount of position error can be derived without depending on the skills of the workers. Further, the mean square error may be treated as the position error, or the position error may be derived by multiplying the mean square error by a constant, or by adding the constant to the mean square error. Particularly, by having the error calculation portion quantitatively derive the amount of an error in position alignment that changes at every observation and extracting a circuit that passes through a region obtained by widening the coordinates of the abnormal signal by the error amount, a truly failed circuit can be extracted while reducing the number of pseudo-failed circuits extracted.

Figure 8:
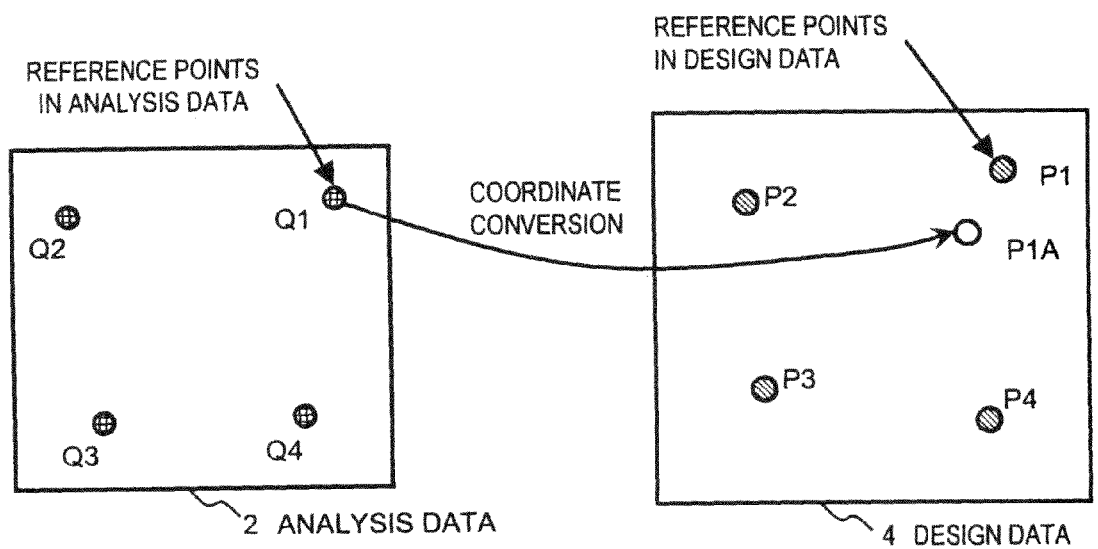
FIG. 8 is a drawing for explaining a position error in an example of the present invention.

Further, for instance, in the failure analysis apparatus 10 for a semiconductor integrated circuit according to a mode of the present invention, the coordinate conversion portion 5 derives correspondences between the coordinates (for instance coordinate correspondences between Q1 to Q4 and P1 to P4 in FIG. 8) for a number of the reference points exceeding a minimum required number for deriving a coordinate conversion formula, tentatively derives a coordinate conversion formula using an arbitrary number of reference points among the reference points for which coordinate correspondences are derived, derives the sum of the position error of each reference point as the conversion error using the tentatively derived coordinate conversion formula, and deems the coordinate conversion formula that derives the smallest conversion error as the final coordinate conversion formula. Since the accuracy of the coordinate conversion formula is affected by how the reference points are taken, according to the configuration described above, coordinate conversion formulas are derived from a plurality of ways to take reference points, and the coordinate conversion formula that derives the minimum error can be selected as the final coordinate conversion formula from the coordinate conversion formulas derived. Particularly, even when the observed image is distorted due to unevenness of the observed surface, an error in position alignment can be kept to a minimum. Further, by quantitatively deriving the amount of an error in position alignment that changes at every observation and extracting a circuit that passes through a region obtained by widening the coordinates of the abnormal signal by the error amount, a truly failed circuit can be extracted while reducing the number of pseudo-failed circuits extracted.

Further, in the failure analysis apparatus 10 for a semiconductor integrated circuit according to a mode of the present invention, the coordinate conversion formula uses a projective transformation (refer to Formulas (3) and (4) as examples) and the coordinate conversion portion 5 calculates parameters of the projective transformation from the coordinates of at least four reference points in the device coordinate system and the design coordinate system. When the coordinate conversion formula by the projective transformation requires eight parameters (a0, b0, a1, b1, c1, a2, b2, c2), the parameters are derived from the coordinates of at least four reference points in the device coordinate system and the design coordinate system. As a result, even when there is an image distortion such that a rectangular region of the sample becomes an arbitrary convex quadrilateral region of the analysis image because of an inclination of the observed surface, an error in position alignment can be kept to a minimum.

Further, as shown in FIG. 6, in the failure analysis apparatus 10 for a semiconductor integrated circuit according to a mode of the present invention, the coordinate conversion formula uses a movement amount (x0, y0), a rotation amount $\theta$, an inclination amount $\beta$, and an elasticity amount ($\lambda x, \lambda y$), and the coordinate conversion portion 5 calculates the movement amount, the rotation amount, the inclination amount, and the elasticity amount from the coordinates of at least three reference points in the device coordinate system and the design coordinate system. The six parameters, the movement amount (x0, y0), the rotation amount $\theta$, the inclination amount $\beta$, and the elasticity amount ($\lambda x, \lambda y$), are derived from the coordinates of at least three pairs of reference points. As a result, even when there is an image distortion such that a rectangular region of the sample becomes a parallelogram of the analysis image because of an inclination of the observed surface, an error in position alignment can be kept to a minimum.

Further, a failure analysis program 25 for a semiconductor integrated circuit according to a mode of the present invention causes a computer 30 (FIG. 12) to execute the failure analysis method (FIGS. 1 and 2) described above. In other words, by installing the failure analysis program 25 according to the present invention on a general-purpose computer shown in FIG. 12 such as an engineering workstation and personal computer, the computer is able to execute the failure analysis method shown in FIGS. 1 and 2.

Further, the failure analysis program 25 for a semiconductor integrated circuit according to a mode of the present invention causes the computer 30 (FIG. 12) to function as the failure analysis apparatus 10 (FIG. 9). Further, in FIG. 9, if the analysis data 2 comes from the results of an inspection performed by the semiconductor inspection apparatus 1, the failure analysis apparatus 10 may not have to include the semiconductor inspection apparatus 1. If the failure analysis apparatus 10 includes the semiconductor inspection apparatus 1, the failure analysis program 25 may control the semiconductor inspection apparatus 1. Examples will be described in detail with reference to the drawings below.

Example 1

FIG. 2 is a detailed process flowchart of the failure analysis method for a semiconductor integrated circuit according to Example 1. In FIG. 2, step S1 is the signal detection process that obtains the coordinates, in the semiconductor inspection apparatus (the device coordinate system), of the abnormal signal obtained from the semiconductor inspection apparatus for a failed LSI. Step S2A is the reference point specifying process that specifies a reference point for coordinate conversion before the next step S2, the coordinate conversion process. Step S2 is the coordinate conversion process that calculates the position relation between coordinates of the device coordinate system and the coordinate system on the design data (the design coordinate system) as the coordinate conversion formula. Step S3 is the error calculation process that calculates a position error between the device coordinate system and the design coordinate system. The position error is derived by converting the coordinates of the reference point in the device coordinate system into coordinates in the design coordinate system using the coordinate conversion formula derived in the step S2, and checking its accuracy by comparing the result of the conversion with the coordinates of the reference point in the design coordinate system directly specified in the step S2A. Step S4A is the signal coordinate calculation process that calculates the design coordinates of the abnormal signal. This step S4A is a preprocessing process for the next step S4, the circuit extraction process. In the step S4A, the coordinates of the abnormal signal in the design coordinate system and its position error range are derived by using the coordinates of the abnormal signal in the device coordinate system derived in the step S1, the coordinate conversion formula derived in the step S2, and the position error derived in the step S3. The step S4 is the circuit extraction process that extracts a circuit related to the abnormal signal using the coordinates of the abnormal signal in the design coordinate system and its position error range derived in the step S4A.

The semiconductor inspection apparatus used in the step S1 may be an emission analysis device that detects a light emission as an abnormal signal, an OBIRCH analysis device that detects an OBIRCH reaction as an abnormal signal, or any semiconductor inspection apparatus that supplies an electric signal, infrared light beam, visible light, ultraviolet light, laser light, X-ray, electron, ion, ultrasound, and vibration to an LSI and that detects an electric signal, infrared light beam, visible light, ultraviolet light, laser light, X-ray, electron, ion, ultrasound, and vibration as an abnormal signal.

Figure 3:
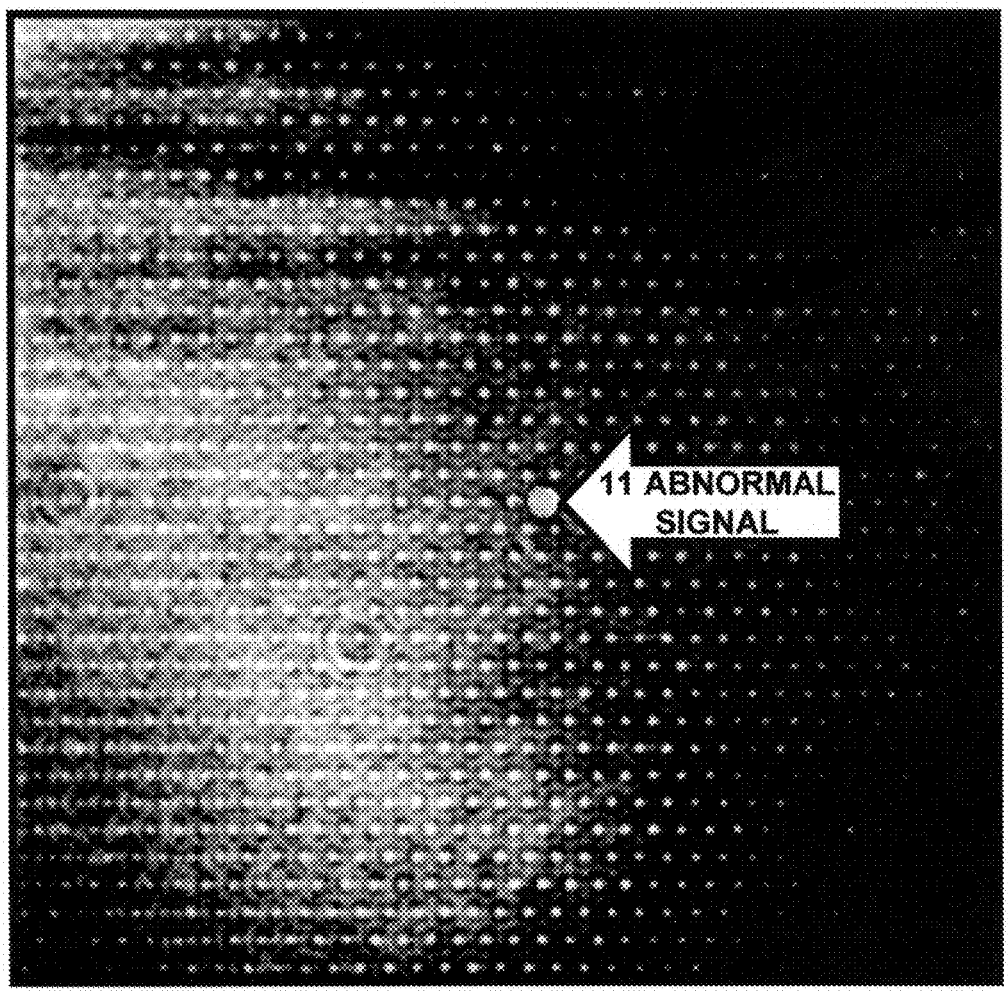
FIG. 3 is the image data of a light emitting image observed by an emission microscope as an abnormal signal.

FIG. 3 shows the image data of a light emitting image observed by an emission microscope as an abnormal signal 11 as an example of an abnormal signal detected by the semiconductor inspection apparatus. As shown in FIG. 3, the semiconductor inspection apparatus is able to detect an observed image of a semiconductor integrated circuit, which is an inspection target, and an abnormal signal appearing in the observed image as image data. In the step S1, the coordinates of this abnormal signal 11 in the analysis image in the device coordinate system are derived.

Next, in the reference point specifying process step S2A, in addition to the observed image of the semiconductor integrated circuit obtained from the semiconductor inspection apparatus, the image data of the design data is displayed from the circuit layout design data of the semiconductor integrated circuit, which is the analysis target. The observed image and the design data may be displayed separately, side by side as shown in FIG. 4, or superimposed as shown in FIG. 5. Further, in the reference point specifying process step S2A, by selecting a point in the semiconductor integrated circuit, the analysis target, as a reference point (actual reference point), and specifying a coordinate in the design data that corresponds to the actual reference point as a reference point (design reference point), the device coordinates of actual points and the design coordinates of design reference points are specified for a plurality of reference points. FIG. 4 shows an example of a method for specifying reference points. In FIG. 4, the observed image (analysis data) and the design data are displayed side by side, and two points visually recognized to be in the same place are specified as reference points. In FIG. 4, a point in the observed image is specified as an actual reference point, and a point corresponding to the actual reference point in the design data is specified as a design reference point. A plurality of pairs of reference points obtained as described are specified. FIG. 5 shows a different method for specifying reference points from the method in FIG. 4. In FIG. 5, the image data of the observed image on the semiconductor integrated circuit, which is the analysis target, obtained by the semiconductor inspection apparatus and the design data are displayed superimposed, and the coordinates of an actual reference point and a design reference point are extracted for an arbitrary point on the superimposed images. Generally speaking, since the observed image has image distortion, the design data and the image data do not coincide at all points, however, two coinciding points in the superimposed images can be specified as reference points. As described, the corresponding coordinates in the device coordinate system and the design coordinate system are obtained for a plurality of reference points.

Next, in the coordinate conversion process step S2, the position relation between the device coordinate system and the design coordinate system is derived from the plurality of pairs of reference points (pairs of a reference point in the device coordinate system and a reference point in the design coordinate system) specified in the reference point specifying process step S2A as the coordinate conversion formula. Further, in the error calculation process step S3, the position error between the coordinate of the reference point in the design coordinate system (the coordinate derived in the step S2A) and the coordinate, derived using the coordinate conversion formula, in the design coordinate system is derived. The semiconductor integrated circuit, which is the analysis target, is set on the stage of the semiconductor inspection apparatus as a sample, and the coordinates of the reference points specified in the reference point specifying process (the step S2A) include errors due to an inclination of the sample, irregularities on the observed surface of the sample, and a position error of the stage of the semiconductor inspection apparatus. In order to reduce these errors, in the coordinate conversion process, the position relation between the device coordinate system and the design coordinate system is derived as the coordinate conversion formula for the plurality of pairs of reference points specified in the reference point specifying process in the present example. The parameters of this coordinate conversion formula are derived using a least-squares method. Further, from the position relation between the coordinates of the reference points derived using this coordinate conversion formula and the coordinates of the reference points previously specified, the mean square error for the plurality of pairs of reference points is derived as the position error.

FIG. 6 shows an example of the conversion between the device coordinate system and the design coordinate system. In order to convert the device coordinate system (x, y) into the design coordinate system (X, Y), the movement amount: x0, y0, the rotation amount: θ, the inclination amount: β, and the elasticity amount: λx, λy are derived from an equation created from at least three pairs of reference points (xi, yi) and (Xi, Yi) using a least-squares method. The coordinate conversion formula is written as Formula (1) in a general form:

$$X = f_X(x_i, y_i), Y = f_Y(x_i, y_i) \quad \text{Formula (1)}$$

The error calculation process step S3 derives the mean square error for the reference point pair derived from the position relation between the reference points in the device coordinate system and design coordinate system derived using the coordinate conversion formula. The mean square error when the coordinate conversion formula is expressed by Formula (1) is expressed by Formula (2). The difference between the coordinates in the design coordinate system derived by substituting the coordinates of the reference point in the device coordinate system into the coordinate conversion formula and the coordinates of the reference point in the design coordinate system specified in the step S2A is calculated. Further, by deriving the mean-square sum for the plurality of reference points, the mean square error is derived.

$$\left[ \sqrt{\frac{\sum_{i=1}^{n}(X_i - f_X(x_i, y_i))^2}{n}}, \sqrt{\frac{\sum_{i=1}^{n}(Y_i - f_Y(x_i, y_i))^2}{n}} \right] \quad \text{Formula (2)}$$

Next, in the signal coordinate calculation process step S4A, the design coordinates of the abnormal signal obtained in the signal detection process and the position error are calculated using the coordinate conversion formula obtained in the coordinate conversion process and the position error obtained in the error calculation process.

Further, in the circuit extraction process step S4, a circuit that passes through a region (abnormal signal region) obtained by widening the design coordinates of the abnormal signal obtained in the signal coordinate calculation process by the amount of the position error is extracted from the design data. This extracted circuit is a circuit related to the abnormal signal.

Example 2

Figure 7:
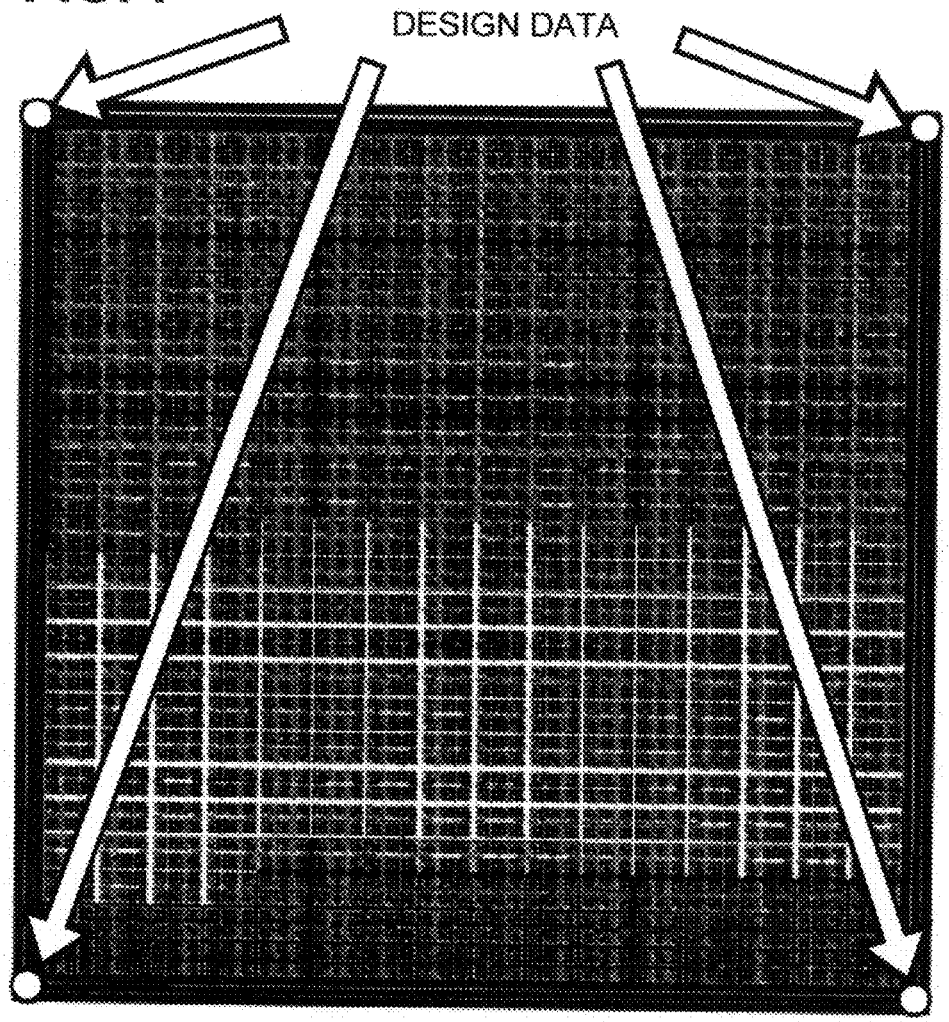
FIG. 7 is an example of reference points in design data in an example of the present invention.

Another failure analysis method for a semiconductor integrated circuit different from Example 1 is described as Example 2 with reference to the drawing. FIG. 7 is an example of reference points on the design data. In the reference specifying process, at least four pairs of reference points are specified. Correspondences between actual reference points and design reference points can be easily seen when visually recognizable points such as the edges of an LSI chip are selected as reference points. In the coordinate conversion process, by calculating the projective transformation parameters from the pairs of reference points using a least-squares method, the coordinate conversion formula between the device coordinate system and the design coordinate system is derived. An example of the coordinate conversion formula using a projective transformation is shown as Formula (3):

$$\begin{bmatrix} X \\ Y \\ 1 \end{bmatrix} = \frac{1}{a_o x + b_o y + 1} \begin{bmatrix} a_1 & b_1 & c_1 \\ a_2 & b_2 & c_2 \\ a_3 & b_3 & 1 \end{bmatrix} \begin{bmatrix} x \\ y \\ 1 \end{bmatrix} \quad \text{Formula (3)}$$

Using a least-squares method, eight parameters ($a_0$, $b_0$, $a_1$, $b_1$, $c_1$, $a_2$, $b_2$, $c_2$) in the coordinate conversion formula is derived from the coordinates in the observed image (xi, yi) and the coordinates (Xi, Yi) in the design data for at least four pairs of reference points. The error calculation process derives the mean square error for the reference pair derived by the coordinate conversion formula. More concretely, the mean square error is derived by substituting the coordinate conversion formula of Formula (4) into Formula (2).

$$f_X(x_i, y_i) = \frac{a_1 x + b_1 y + 1}{a_0 x + b_0 y + 1}, \quad \text{Formula (4)}$$

$$f_Y(x_i, y_i) = \frac{a_2 + b_2 y + 1}{a_0 + b_0 y + 1}$$

Example 3

Yet another failure analysis method for a semiconductor integrated circuit is described as Example 3 with reference to the drawing. In the coordinate conversion process, the coordinate conversion formula between the device coordinate system and the design coordinate system is derived by using pairs of reference points (target reference points) not fewer than the minimum number of pairs required to derive a coordinate conversion formula out of a plurality of pairs of reference points. In the error calculation process, the position error between the coordinates of the reference points in the design coordinate system and the coordinates in the design coordinate system obtained by converting the coordinates of the reference points in the device coordinate system using the coordinate conversion formula is derived for the target reference points derived from the position relation, and the sum of the position error of each target reference point is deemed to be the conversion error.

For instance, for the coordinate conversion formula having the parameters described using FIG. 6: the movement amount, the rotation amount, the inclination amount, and the elasticity amount, it is necessary to specify at least three pairs of reference points in order to derive six conversion parameters. For instance, let's assume that six pairs of reference point are specified. Since the mean square error is zero when three pairs of reference points are employed, four pairs, five pairs, and six pairs of reference points are taken from the six pairs of reference points. The number of four-pair combinations is fifteen, the number of five-pair combinations is six, and the number of six-pair combination is one. In total, there are twenty-two different combinations. A coordinate conversion formula is derived for each of the twenty-two pairs. Further, the distance between a point in the design coordinate system obtained by converting the coordinates of an actual reference point and a design reference point is calculated using the derived coordinate conversion formula. The sum of the distances for all the target reference points directly used for deriving the coordinate conversion formulas is deemed to be the conversion error. The coordinate conversion formula having the smallest conversion error is employed as the final coordinate conversion formula.

FIG. 8 shows relations between the coordinates (Q1 to Q4) of the reference points specified in the observed image (analysis data) in the device coordinate system, the coordinates (P1 to P4) of the reference points specified in the design data in the design coordinate system, and the coordinate (P1A) in the design coordinate system obtained by converting the coordinate P1 in the device coordinate system using the coordinate conversion formula. If the coordinate conversion formula was perfect and there was no distortion in the observed image and no setting error, the coordinate (P1A) obtained by converting the coordinate (the actual coordinate Q1) in the device coordinate system using the coordinate conversion formula would perfectly coincide with the coordinate (the design reference point P1) of the reference point in the design coordinate system. However, they do not perfectly coincide with each other because of reasons such as a distortion in the observed image. There is a distance between P1 and P1A. By treating the sum of this distance for each reference point as the conversion error, and further selecting the coordinate conversion formula having the smallest conversion error as the final coordinate conversion formula, an analysis having a higher coordinate accuracy can be performed.

Here, what matters is to derive the position error between a point in the design coordinate system obtained by converting the coordinates of an actual reference point and a design reference point from the derived coordinate conversion formula, and the conversion error does not have to be the simple sum of the distances. For instance, an error distance (for instance the distance from P1 to P1A in FIG. 8) may be weighted according to the position on the semiconductor integrated circuit such as the distance from the abnormal signal, and the sum of weighted errors may be deemed to be the conversion error.

Example 4

Next, an example of a failure analysis apparatus for a semiconductor integrated circuit will be described as Example 4. FIG. 9 is a block diagram showing the configuration of the failure analysis apparatus 10 for a semiconductor integrated circuit according to Example 4. In FIG. 9, the semiconductor inspection apparatus 1 outputs an observed image of a semiconductor integrated circuit, which is the analysis target, and an abnormal signal included in the observed image as the analysis data 2. The analysis data 2 is an image data outputted from the semiconductor inspection apparatus 1. Note that the failure analysis apparatus 10 does not have to include the semiconductor inspection apparatus 1 if the failure analysis apparatus 10 is able to receive the analysis data 2. The design data 4 is the circuit design layout data of the semiconductor integrated circuit, the analysis target. The signal detection portion 3 detects the coordinates of the abnormal signal from the design data 4 and the analysis data 2. The reference point specifying portion 5A specifies a plurality of reference points and derives the coordinate data of these reference points in the analysis data 2 and the design data 4. The coordinate conversion portion 5 derives the coordinate conversion formula that converts a coordinate in the analysis data into a coordinate in the design data from the coordinates of the reference points in the analysis data 2 and the coordinates of the reference points in the design data 4. The error calculation portion 6 derives the position error when a coordinate in the analysis data is converted into a coordinate in the design data, using the coordinate conversion formula derived by the coordinate conversion portion 5. The signal coordinate calculation portion 7A derives the position error (range) between the coordinates of the abnormal signal derived by the signal detection portion 3 in the device coordinate system (the analysis data 2) and the coordinates of the abnormal signal in the design coordinate system using the coordinate conversion formula derived by the coordinate conversion portion 5 and the position error derived by the error calculation portion 6. The circuit extraction portion 7 extracts a circuit related to the abnormal signal based on the range, which takes the coordinates of the abnormal signal in the design coordinate system derived by the signal coordinate calculation portion 7A and its position error into account. The display portion 8 displays the observed image and the image of the abnormal signal included in the analysis data, the image data of the design data, and the positions of the reference points in the device coordinate system and the design coordinate system.

Further, the failure analysis apparatus of Example 4 shown in FIG. 9 is able to execute the failure analysis methods of Examples 1 to 3 described above. As shown in FIGS. 10 and 11, the display unit 8 displays the analysis data and the design data superimposed, displays the coordinates of the abnormal signal in the design data derived using the coordinate conversion formula as the abnormal signal region, in addition to the abnormal signal 11 in the analysis data, and further displays the range of the abnormal signal in the design data with the position error added as an error considered region 13. Further, when the range of the abnormal signal can be derived from XY coordinates, the error considered region 13 becomes a rectangle as shown in FIG. 10, and when the range of the abnormal signal can be derived as a circular or elliptical region, the error considered region 13 becomes a circular or elliptical region as shown in FIG. 11. Note that the range of the error considered region should include the amount of the error, and its shape is not limited to rectangle or ellipse.

Example 5

Figure 12:
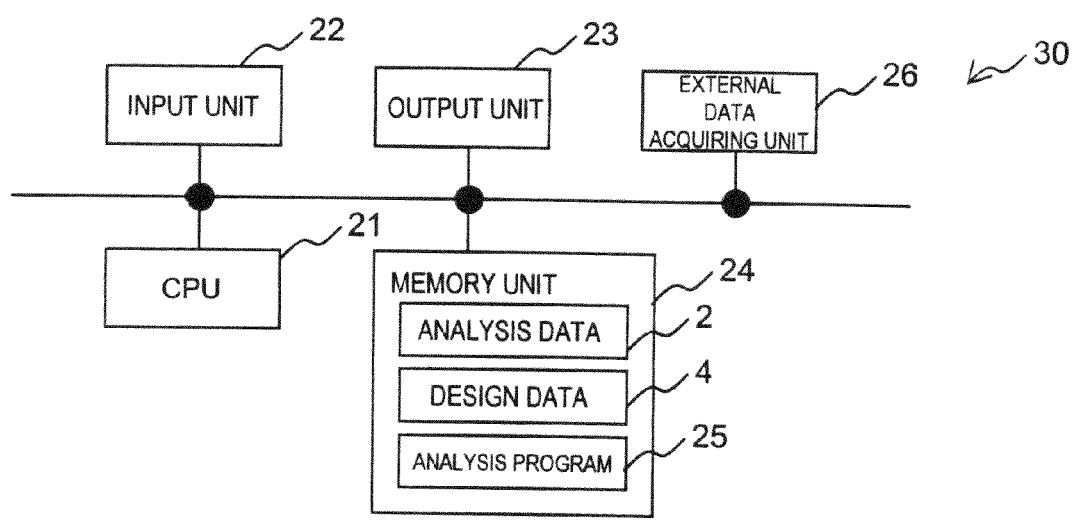
FIG. 12 is a block diagram showing an example of the configuration of a computer capable of being used in the implementation of the present invention.

The above-described failure analysis methods of Examples 1 to 3 and the failure analysis apparatus of Example 4 for a semiconductor integrated circuit can be implemented by the failure analysis program 25 installed on the computer 30 shown in FIG. 12.

In FIG. 12, the computer 30 comprises a CPU 21, an input unit 22 that inputs instructions for executing a program, an output unit 23, a memory unit 24, and an external data acquiring unit 26 that acquires the analysis data 2 and the design data 4 obtained from the semiconductor inspection apparatus 1. The memory unit 24 may include an auxiliary storage device such as a magnetic storage medium or optical storage medium such as a hard disk, CD, DVD, in addition to a main storage device such as a cache and semiconductor memory.

The memory unit 24 stores the failure analysis program 25 that has the CPU execute the signal detection process, the reference point specifying process, the coordinate conversion process, the error calculation process, the signal coordinate calculation process, and the circuit extraction process described in Examples 1 to 3. Further, the analysis data 2 and the design data 4 acquired externally are stored in the memory unit 24 as well.

In the output unit 23, the analysis data 2, the design data 4, and these data superimposed are displayed. Further, the region obtained by widening the coordinates of the abnormal signal by the amount of the position error is also displayed. The input unit 22, the CPU 21, the memory unit 24, the external data acquiring unit 26, and the output unit 23 are connected by a bus line respectively.

Further, the computer 30, on which the failure analysis program 25 for a semiconductor integrated circuit is installed, functions as the failure analysis apparatus 10 having the signal detection portion 3, the reference point specifying portion 5A, the coordinate conversion portion 5, the error calculation portion 6, the signal coordinate calculation portion 7A, and the circuit extraction portion 7. This computer may be a general engineering workstation or personal computer comprising the output unit 23 such as a display, the input unit 22 such as a keyboard and mouse, the auxiliary storage device such as a DVD or CD-ROM drive, and an external interface function such as an Internet connection ability. Further, the failure analysis program for a semiconductor integrated circuit can be installed on the computer via a storage medium such as a semiconductor memory, magnetic storage device, and optical storage device or via the Internet.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

The present invention can be widely used for failure analysis on a semiconductor integrated circuit. By using the present invention, a failure of a semiconductor integrated circuit can easily be analyzed on the circuit level, and the quality and yield of semiconductor integrated circuits can be improved.

What is claimed is:

1. A failure analysis method, for a semiconductor integrated circuit, said method comprising:
   deriving a coordinate in a device coordinate system in analysis data for abnormal signal data included in analysis data of a semiconductor integrated circuit obtained from a semiconductor inspection apparatus;
   deriving a correspondence between a coordinate in said device coordinate system and a coordinate in a design coordinate system in design data of said semiconductor integrated circuit for a plurality of reference points in said semiconductor integrated circuit;
   deriving a coordinate conversion formula between the device coordinate system and the design coordinate system;
   deriving a position error between a coordinate in said device coordinate system converted by said coordinate conversion formula and a coordinate in said design coordinate system; and
   extracting a circuit related to an abnormal signal in said design data based on the coordinates of said abnormal signal in said device coordinate system using said coordinate conversion formula and said position error, and
   displaying image data of said analysis data and image data of said design data, wherein,
   said coordinate conversion includes specifying said plurality of reference points,
   said extracting a circuit includes a signal coordinate calculation that derives a range of the abnormal signal in said design coordinate system using said coordinate conversion formula and said position error, and
   said specifying lets a user input coordinates of said reference points in said device coordinate system and said design coordinate system using the image data of said analysis data and said design data of said semiconductor integrated circuit.

2. The failure analysis method as defined in claim 1, wherein said plurality of reference points are specified when coordinates are converted, and
   a range of the abnormal signal in said design coordinate system is derived using said coordinate conversion formula and said position error when said circuit is extracted.

3. The failure analysis method as defined in claim 1, wherein said coordinate conversion formula is calculated for a plurality of coordinates in said device coordinate system, said design coordinate system respectively using a least-squares method when said coordinates are converted.

4. The failure analysis method as defined in claim 1 wherein, when said position error is derived, a mean square error by said coordinate conversion formula is derived for a plurality of coordinates, and said position error is derived from said mean square error.

5. The failure analysis method as defined in claim 1 wherein, when said coordinates are converted, correspondences between said coordinates are derived for a number of said reference points exceeding a minimum required number for deriving a coordinate conversion formula, a coordinate conversion formula is tentatively derived using an arbitrary number of reference points among the reference points for which coordinate correspondences are derived, a sum of a position error of each reference point is derived as a conversion error using said tentatively derived coordinate conversion formula, and a coordinate conversion formula that derives a smallest conversion error is deemed a final coordinate conversion formula.

6. The failure analysis method as defined in claim 1, wherein said coordinate conversion formula comprises a coordinate conversion formula using a projective transformation, and when said coordinates are converted, parameters of said projective transformation are calculated from coordinates of at least four of said reference points in said device coordinate system and said design coordinate system.

7. The failure analysis method as defined in claim 1, wherein
   said coordinate conversion formula comprises a coordinate conversion formula using a movement amount, a rotation amount, an inclination amount, and an elasticity amount, and
   when said coordinates are converted, said movement amount, said rotation amount, said inclination amount, and said elasticity amount are calculated from coordinates of at least three said reference points in said device coordinate system and said design coordinate system.

8. A failure analysis apparatus, for a semiconductor integrated circuit, said apparatus comprising:
   a signal detection portion that derives a coordinate in a device coordinate system in analysis data for abnormal signal data included in analysis data of a semiconductor integrated circuit obtained from a semiconductor inspection apparatus;

a coordinate conversion portion that derives a correspondence between a coordinate in said device coordinate system and a coordinate in said design coordinate system in design data of said semiconductor integrated circuit for a plurality of reference points in said semiconductor integrated circuit, and that derives a coordinate conversion formula between the device coordinate system and the design coordinate system;

an error calculation portion that derives a position error between a coordinate in said device coordinate system converted by said coordinate conversion formula and a coordinate in said design coordinate system;

a circuit extraction portion that extracts a circuit related to said abnormal signal in said design data based on coordinates of an abnormal signal in said device coordinate system using said coordinate conversion formula and said position error, and a display unit that displays image data of said analysis data and image data of said design data, wherein, said coordinate conversion portion includes a reference point specifying portion that specifies said plurality of reference points, said circuit extraction portion includes a signal coordinate calculation portion that derives a range of the abnormal signal in said design coordinate system using said coordinate conversion formula and said position error, and said reference point specifying portion lets a user input coordinates of said reference points in said device coordinate system and said design coordinate system using the image data of said analysis data and said design data displayed by said display unit.

9. The failure analysis apparatus as defined in claim 8, wherein said display unit displays the image data of said analysis data including said abnormal signal and the image data of said design data including an image of the range of the abnormal signal derived by said signal coordinate calculation portion superimposed.

10. The failure analysis apparatus as defined in claim 8, wherein said coordinate conversion portion calculates said coordinate conversion formula for a plurality of coordinates in said device coordinate system and said design coordinate system respectively using a least-squares method.

11. The failure analysis apparatus as defined in claim 8, wherein said error calculation portion derives a mean square error by said coordinate conversion formula for a plurality of coordinates, and said position error is derived from said mean square error.

12. The failure analysis apparatus as defined in claim 8, wherein said coordinate conversion portion derives correspondences between said coordinates for a number of said reference points exceeding a minimum required number for deriving a coordinate conversion formula, tentatively derives a coordinate conversion formula using an arbitrary number of reference points among the reference points for which coordinate correspondences are derived, derives a sum of a position error of each reference point as a conversion error using said tentatively derived coordinate conversion formula, and deems a coordinate conversion formula that derives a smallest conversion error as a final coordinate conversion formula.

13. The failure analysis apparatus as defined in claim 8, wherein said coordinate conversion formula uses a projective transformation, and said coordinate conversion portion calculates parameters of said projective transformation from coordinates of at least four of said reference points in said device coordinate system and said design coordinate system.

14. The failure analysis apparatus as defined in claim 8, wherein
said coordinate conversion formula uses a movement amount, a rotation amount, an inclination amount, and an elasticity amount, and
said coordinate conversion portion calculates said movement amount, said rotation amount, said inclination amount, and said elasticity amount from coordinates of at least three said reference points in said device coordinate system and said design coordinate system.

15. A failure analysis program which causes a computer to execute the failure analysis method as defined in claim 1.

16. A failure analysis program which causes a computer to function as the failure analysis apparatus as defined in claim 8.

17. A computer readable storage medium storing said program as defined in claim 15.

18. A computer readable storage medium storing said program as defined in claim 16.

* * * * *